(12) United States Patent
Fujisawa et al.

(10) Patent No.: US 7,701,781 B2
(45) Date of Patent: Apr. 20, 2010

(54) SEMICONDUCTOR MEMORY DEVICE WITH MEMORY CELL INCLUDING A CHARGE STORAGE LAYER AND A CONTROL GATE AND METHOD OF CONTROLLING THE SAME

(75) Inventors: Shinya Fujisawa, Hachioji (JP);
Tokumasa Hara, Kawasaki (JP);
Takahiro Suzuki, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 224 days.

(21) Appl. No.: 12/019,245

(22) Filed: Jan. 24, 2008

(65) Prior Publication Data

US 2008/0181022 A1 Jul. 31, 2008

(30) Foreign Application Priority Data

Jan. 25, 2007 (JP) ............................. 2007-015192

(51) Int. Cl.
*G11C 7/10* (2006.01)

(52) U.S. Cl. .............................. 365/189.04; 365/185.11

(58) Field of Classification Search ............ 365/189.04, 365/185.11, 189.011, 185.29
See application file for complete search history.

(56) References Cited

U.S. PATENT DOCUMENTS 6,459,640 B1 * 10/2002 Tani et al. .................. 365/218
6,549,469 B2 * 4/2003 Gochi .................... 365/189.14
6,606,277 B2 * 8/2003 Takahashi ................. 365/233.1
6,903,983 B2   6/2005 Hara et al.
2006/0245253 A1   11/2006 Hebishima

FOREIGN PATENT DOCUMENTS

JP    2003-196987    7/2003

\* cited by examiner

*Primary Examiner*—Vu A Le
(74) *Attorney, Agent, or Firm*—Oblon, Spivak, McClelland, Maier & Neustadt, L.L.P.

(57) ABSTRACT

A semiconductor memory device is capable of simultaneously carrying out a first operation and a second operation. The semiconductor memory device includes first and second control circuits, a select control circuit, and a select circuit. The first control circuit controls the first operation according to a first address signal and outputs a read start signal when the reading of the data is started. The second control circuit controls the second operation according to a second address signal and outputs a sequence flag when the first and second addresses coincide with each other. The select control circuit generates a select control signal. The select control signal is asserted if the second operation is carried out. The first control circuit instructs the select circuit to select the sequence flag if the select control signal is asserted or the data if the select control signal is negated.

10 Claims, 12 Drawing Sheets

Memory cell unit

Memory cell array

FIG. 7  CASE 1

FIG. 9 CASE 2

FIG. 11  CASE 3

SEMICONDUCTOR MEMORY DEVICE WITH MEMORY CELL INCLUDING A CHARGE STORAGE LAYER AND A CONTROL GATE AND METHOD OF CONTROLLING THE SAME

CROSS-REFERENCE TO RELATED APPLICATIONS

This application is based upon and claims the benefit of priority from prior Japanese Patent Application No. 2007-015192, filed Jan. 25, 2007, the entire contents of which are incorporated herein by reference.

BACKGROUND OF THE INVENTION

1. Field of the Invention

This invention relates to a semiconductor memory device and a method of controlling the semiconductor memory device, and more particularly to a semiconductor memory with memory cell including a charge storage layer and a control gate.

2. Description of the Related Art

An electrically erasable and programmable ROM (EEPROM) has been known as a nonvolatile semiconductor memory capable of rewriting data electrically. Some EEPROMs have an automatic operating function and a synchronous reading function capable of being executed simultaneously with the automatic operating function. Such an EEPROM has been disclosed in, for example, Jpn. Pat. Appln. KOKAI Publication No. 2003-196987.

The automatic operating function is the function of writing and erasing data automatically by externally inputting a command. The synchronous reading function is the function of reading data in synchronization with a clock by externally inputting a command.

In an EEPROM having the automatic operating function and synchronous reading function, the memory cell array is divided into banks. When a bank in an automatic operation is accessed for synchronous reading, a sequence flag is externally output in place of read data. From the sequence flag, it is recognized that the bank is in an automatic operation and therefore is inhibited from being accessed.

However, with a conventional EEPROM, if the automatic operation ends immediately after a synchronous read operation has started, the sequence flag might not be output properly, resulting in a malfunction.

BRIEF SUMMARY OF THE INVENTION

A semiconductor memory device capable of simultaneously carrying out a first operation of reading data from nonvolatile memory cells and a second operation of writing data into or erasing data from the memory cells, the semiconductor memory device according to an aspect of the present invention includes:

a memory cell array which includes the memory cells;

a first control circuit which controls the first operation according to a first address signal and outputs a read start signal when the reading of the data is started;

a second control circuit which controls the second operation according to a second address signal and outputs a sequence flag when the first and second addresses coincide with each other;

a latch circuit which latches the sequence flag;

a select control circuit which generates a read start pulse signal and a select control signal and which generates the read start pulse signal by delaying the read start signal, the select control signal, when the sequence flag is output, being asserted if the second operation is being carried out or being negated if the second operation has not been carried out at the time the output of the read start pulse signal ends; and a select circuit selects either the sequence flag held in the latch circuit or the data read by the first control circuit according to an instruction from the first control circuit and outputs the selected one, the first control circuit instructing the select circuit to select the sequence flag if the select control signal is asserted or the data if the select control signal is negated.

A method of controlling a semiconductor memory device according to an aspect of the present invention includes:

performing a first operation on a memory bank in a second operation, data being read in the first operation, data being written or erased in the second operation, and the memory bank including a plurality of memory cells;

outputting a pulse-like read start signal in response to the start of the first operation;

outputting a read start pulse signal by delaying the read start signal;

outputting a sequence flag indicating that the first operation and the second operation are being performed on the same memory bank;

ending the second operation;

ending the output of the sequence flag in response to the end of the second operation;

latching the sequence flag at the earlier one of the time the output of the sequence flag ends and the time the output of the read start pulse signal ends, if the time the second operation ends is later than the time the output of the read start pulse signal ends; and outputting the data read in the first operation after the sequence flag is latched, regardless of the content of the latched sequence flag.

DETAILED DESCRIPTION OF THE INVENTION

A semiconductor memory device and a method of controlling the semiconductor memory device according to an embodiment of the invention will be explained.

Figure 1:
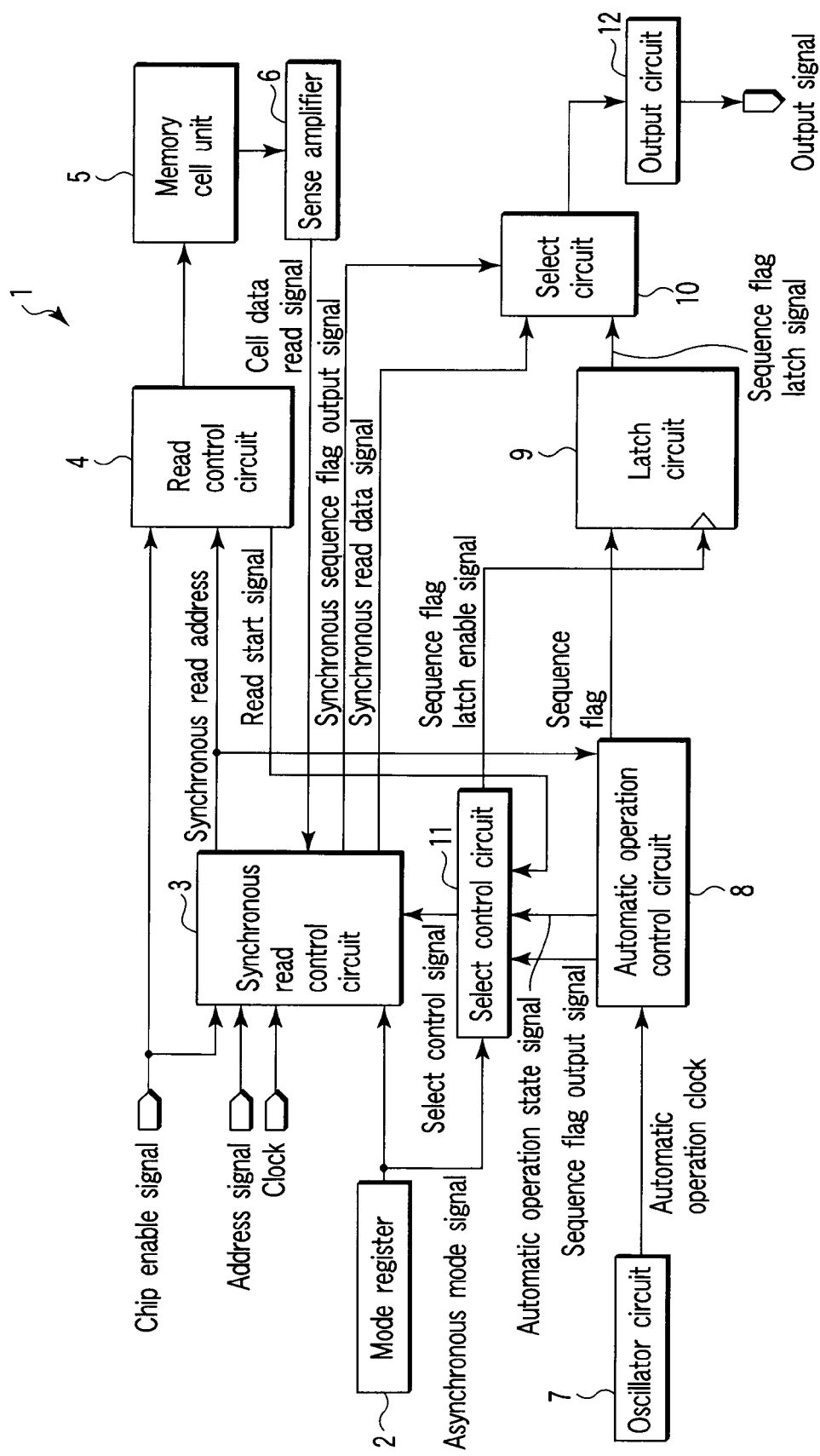
FIG. 1 is a block diagram of a flash memory according to an embodiment of the invention.

FIG. 1 is a block diagram of a NOR flash memory according to the embodiment.

A NOR flash memory of the embodiment has two operation modes, a first operation mode and a second operation mode. The first operation mode is an operation mode in which data is read by externally inputting an address. The first operation mode has two operation modes: a synchronous read operation of reading data in synchronization with a clock and an asynchronous read operation of reading data without synchronizing with a clock. Hereinafter, the synchronous read operation will be explained in the first operation mode unless otherwise stated. The second operation mode is an operation mode in which data is automatically written and erased in synchronization with the clock by externally inputting a command. Hereinafter, the first operation mode is sometimes called a read operation or a synchronous read operation and the second operation mode is sometimes called an automatic operation. Moreover, the first operation mode and the second operation mode can be carried out simultaneously.

As shown in FIG. 1, the flash memory 1 includes a mode register 2, a synchronous read control circuit 3, a read control circuit 4, a memory cell unit 5, a sense amplifier 6, an oscillator circuit 7, an automatic operation control circuit 8, a latch circuit 9, a select circuit 10, a select control circuit 11, and an output circuit 12.

The mode register 2 holds information as to whether the read operation in progress is a synchronous read operation or an asynchronous read operation. If it is an asynchronous read operation, an asynchronous mode signal is output to the synchronous read control circuit 3 and select control circuit 11. The asynchronous mode signal is a signal output (asserted: made high level (H) in the embodiment) while an asynchronous read operation is being carried out.

Receiving a chip enable signal, an address signal, and a clock from the outside, the synchronous read control circuit 3 further receives an asynchronous read signal from the mode register 2 and then operates. The synchronous read control circuit 3 supervises the control of the synchronous read operation. Accordingly, the synchronous read control circuit 3 operates when the asynchronous read signal is not output (is negated). On the basis of the received address signal and clock, the synchronous read control circuit 3 generates a synchronous read address and outputs the synchronous read address to the read control circuit 4 and automatic operation control circuit 8. A synchronous read address is the address of a memory cell from which data is to be read. Furthermore, the synchronous read control circuit 3 receives a cell data read signal from the sense amplifier 6 and outputs the read signal as a synchronous read data signal to the select circuit 10. Moreover, on the basis of the select control signal from the select control circuit 11, the synchronous read control circuit 3 outputs a synchronous sequence flag output signal. The details of the select control signal and synchronous sequence flag output signal will be described later.

Receiving a chip enable signal from the outside, the read control circuit 4 operates. Then, the read control circuit 4 receives a synchronous read address from the synchronous read control circuit 3 in a synchronous read operation and instructs the memory cell unit 5 to read data from the memory cell corresponding to the synchronous read address. Moreover, when the synchronous read operation is started, the read control circuit 4 generates a read start signal indicating the start of the synchronous read operation and outputs the read start signal to the select control circuit 11. The read start signal is a pulse signal which is asserted (made "H" level in the embodiment) at the same time or immediately after the synchronous read operation is started for only a specific period of time.

Figure 2:
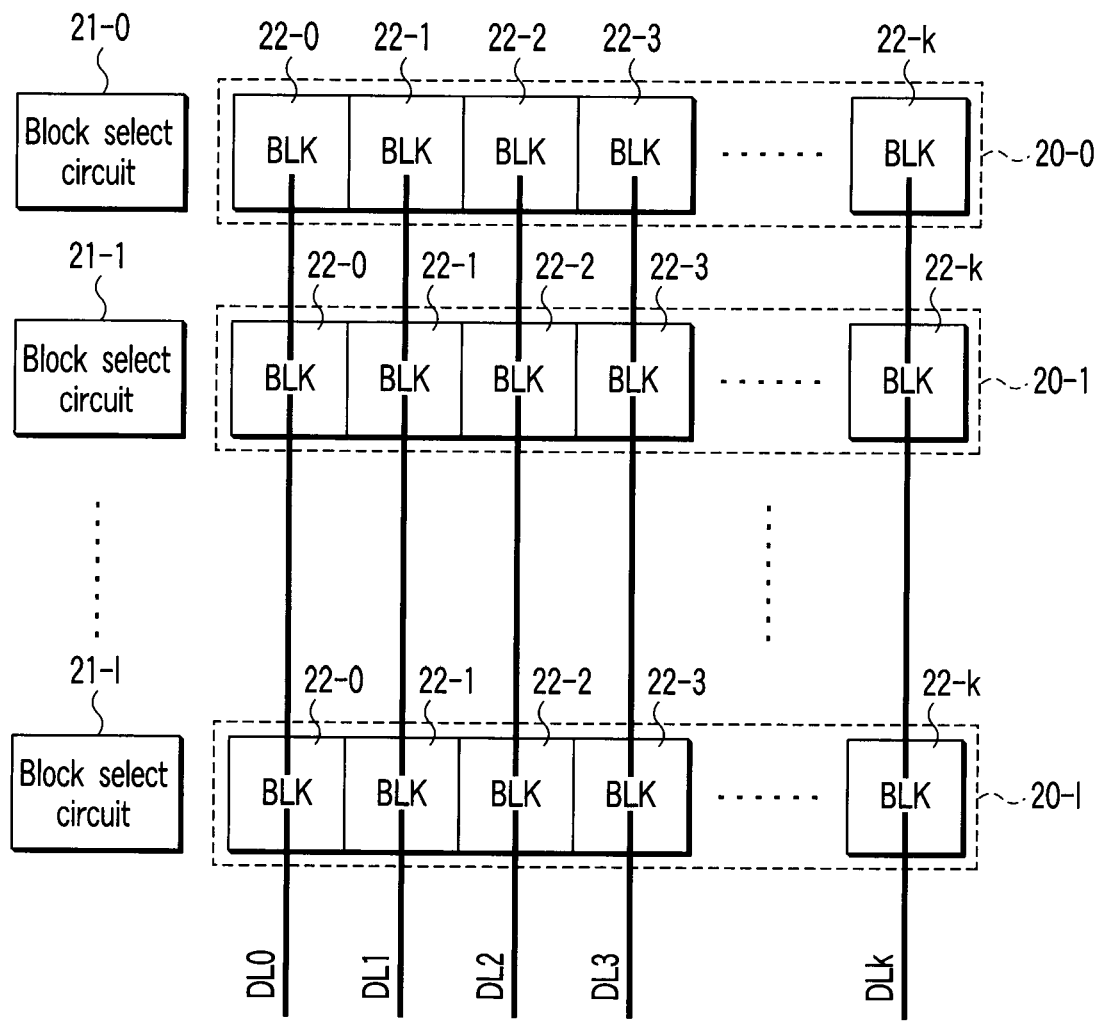
FIG. 2 is a circuit diagram of a memory cell unit according to the embodiment.

The memory cell unit 5 includes nonvolatile memory cells which store externally supplied data. FIG. 2 is a block diagram schematically showing the configuration of the memory cell unit 5. As shown in FIG. 2, the memory cell unit 5 includes (l+1) memory banks 20-1 to 20-l (where l is a natural number greater than or equal to 1) and block select circuits 21-0 to 21-l provided so as to correspond to the memory banks 20-1 to 20-l. Hereinafter, each of the memory banks 20-1 to 20-l and each of the block select circuits 21-0 to 21-l are simply referred to as the memory bank 20 and block select circuit 21 respectively unless they are particularly distinguished from one another.

Each of the memory banks 20-1 to 20-l includes (k+1) memory blocks 22-0 to 22-k (where k is a natural number greater than or equal to 1). The memory blocks 22-0 to 22-k are connected to data lines DL0 to DLk, respectively. Hereinafter, each of the memory blocks 22-0 to 22-k and each of the data lines DL0 to DLk are simply referred to as the memory block 22 and data line DL respectively unless they are particularly distinguished from one another.

Figure 3:
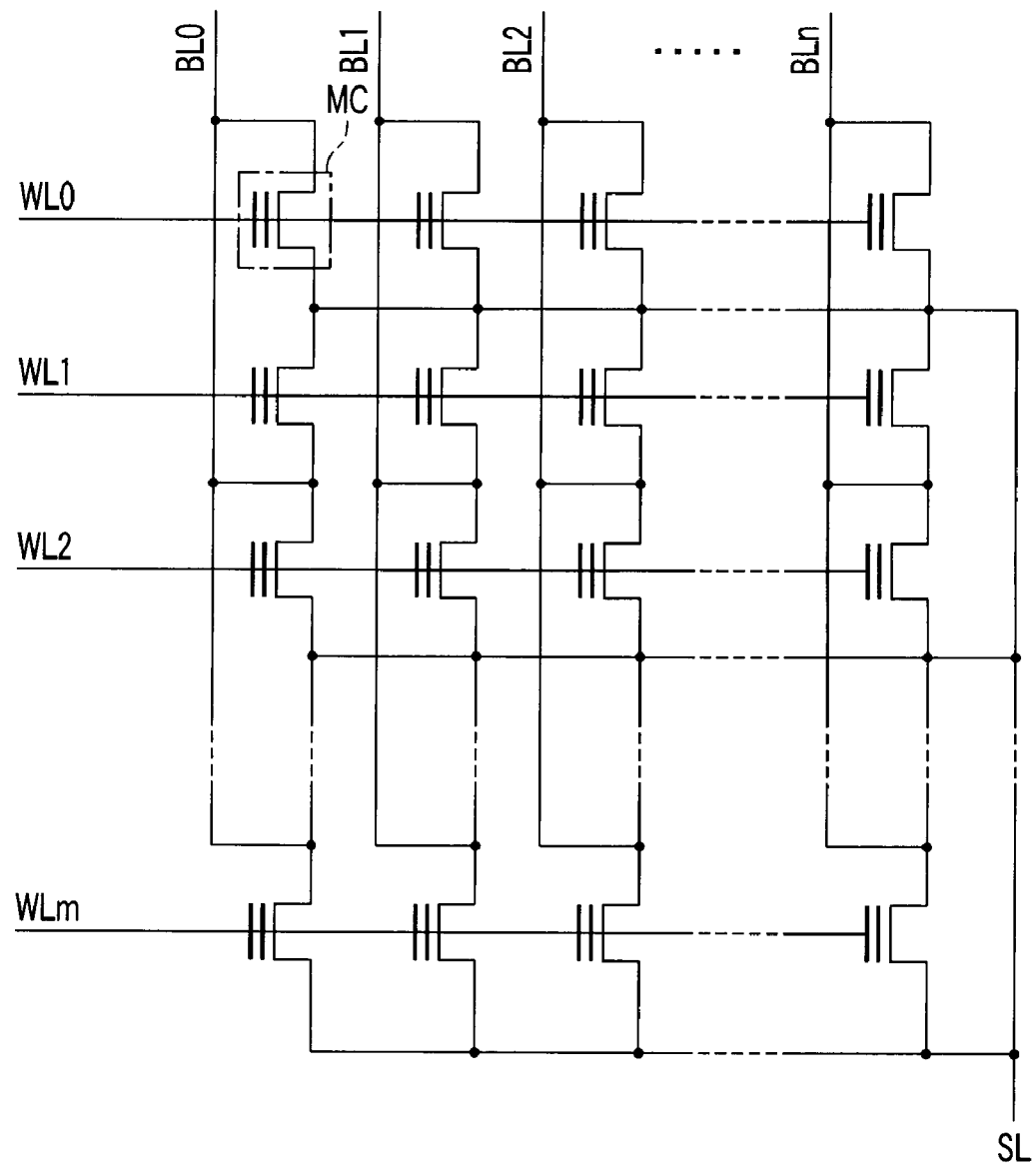
FIG. 3 is a circuit diagram of a memory cell array according to the embodiment.

Each of the memory blocks 22 includes a memory cell array in which memory cells are arranged in a matrix, a row decoder which selects the row direction of the memory cell array and a column decoder which selects the column direction of the memory cell array. The configuration of the memory cell array will be explained using FIG. 3. FIG. 3 is a circuit diagram of the memory cell array.

As shown in FIG. 3, the memory cell array includes ((m+1)×(n+1)) memory cells MC (m and n are natural numbers). Each of the memory cells MC is a MOS transistor which has a stacked gate including a charge storage layer (e.g., a floating gate) and a control gate. The structure of the stacked gate is as follows. A charge storage layer is formed on a semiconductor substrate with a gate insulating film interposed therebetween. A control gate is formed on the charge storage layer with an inter-gate insulating film interposed therebetween. The charge storage layer and control gate are formed using, for example, a polysilicon layer. The gate insulating film is formed using, for example, a silicon oxide film. The inter-gate insulating film is made of, for example, a silicon oxide film, or an ON film, NO film, or ONO film having a stacked structure of a silicon oxide film and a silicon nitride film. The control gates of the memory cells MC in the same row are connected commonly to any one of word lines WL0 to WLm. The drains of the memory cells MC in the same column are connected commonly to any one of bit lines BL0 to BLn. The sources of the memory cells MC are connected commonly to the same source line SL. Hereinafter, for convenience of explanation, word lines WL0 to WLm and bit lines BL0 to BLn may be collectively referred to as the word lines WL and the bit lines BL, respectively.

Then, the row decoder (not shown) selects any one of the word lines WL and the column decoder selects any one of the bit lines BL. The bit line BL selected by the column decoder is connected to any one of data lines BL0 to DLk. Any one of data lines BL0 to DLk is selected by the column decoder (not shown). The selected data line is connected to the sense amplifier 6.

The block select circuits 21-0 to 21-l are provided so as to correspond to the memory banks 20-0 to 20-l, respectively. The block select circuit 21 selects not only the corresponding memory bank 20 but also any one of the memory blocks 22 in the memory bank 20 under the control of the read control circuit 4 in a synchronous read operation or under the control of the automatic operation control circuit 8 in an automatic operation. Then, in the memory block 22 selected by the block select circuit 21, the row decoder and column decoder select a memory cell MC.

In the memory cell unit 5 with the above configuration, a selecting operation is carried out in units of a memory bank 20 in an automatic operation and a synchronous read operation. Moreover, data is erased in units of a memory block 22. That is, the data in all of the memory cells MC included in any one of the memory blocks 22 in the selected memory bank 20 are erased simultaneously.

To return to FIG. 1, the explanation will be continued. The sense amplifier 6 amplifies the data read from a memory cell MC in the memory cell unit 5. Then, the sense amplifier 6 outputs the amplified read data (sometimes referred to as cell data) as a cell data read signal to the synchronous read control circuit 3.

The oscillator circuit 7 generates a clock in an automatic operation. The clock is supplied as an automatic operation clock to the automatic operation control circuit 8.

The automatic operation control circuit 8 operates in synchronization with the automatic operation clock. The automatic operation control circuit 8 internally generates an address and controls the operation of writing data into or erasing data from a memory cell MC in an automatic operation. The automatic operation control circuit 8 outputs (asserts, that is, makes low level in the embodiment) an automatic operation state signal during the automatic operation. When an automatic operation has not been carried out, the automatic operation state signal is not output and negated (made high (H) level). Moreover, the automatic operation control circuit 8 determines whether the memory bank 20 accessed in an automatic operation is identical with the memory bank 20 accessed in a synchronous read operation. The determination is made by referring to the internally generated address and the synchronous read address supplied from the synchronous read control circuit 3 and determining whether the addresses of the two memory banks 20 coincide with each other. Then, if they are identical with each other, a sequence flag is output. The sequence flag is a flag indicating that an automatic operation is in progress. At the same time, a sequence flag output signal indicating that a sequence flag is now being output is output to the select control circuit 11.

The latch circuit 9 latches the sequence flag output from the automatic operation control circuit 8. Then, the latch circuit 9 outputs the latched sequence flag as a sequence flag latch signal to the select circuit 10.

The select circuit 10 selects one of the synchronous read data signal supplied from the synchronous read control circuit 3 and the sequence flag latch signal supplied from the latch circuit 9 and outputs the selected signal. The selecting operation is carried out on the basis of the synchronous sequence flag output signal supplied from the synchronous read control circuit 3. Specifically, when the synchronous sequence flag output signal is asserted (or made "H" level in the embodiment), the sequence flag latch signal is selected. When the synchronous sequence flag output signal is negated, the synchronous read data signal is selected.

The output circuit 12 externally outputs the signal supplied from the select circuit 10 as an output signal from an output pad.

The select control circuit 11 generates a sequence flag latch enable signal and determines data fix timing in the latch circuit 9. When the sequence flag latch enable signal is made low (L) level, the latch circuit 9 is allowed to take in the sequence flag and, when the sequence flag latch enable signal is made high (H) level, the data in the latch circuit 9 is fixed. Moreover, the select control circuit 11 outputs a select control signal and supplies the signal to the synchronous read control circuit 3. When the select control signal is output (or is asserted, that is, made "H" level in the embodiment), the synchronous read control circuit 3 asserts a synchronous sequence flag output signal (or makes the signal "H" level). That is, the select circuit 10 selects the sequence flag latch signal. On the other hand, when the select control signal is not output (or is negated, that is, made "L" level), the synchronous read control circuit 3 negates (or makes "L" level) the synchronous sequence flag output signal. That is, the select circuit 10 selects the synchronous read data signal.

Figure 4:
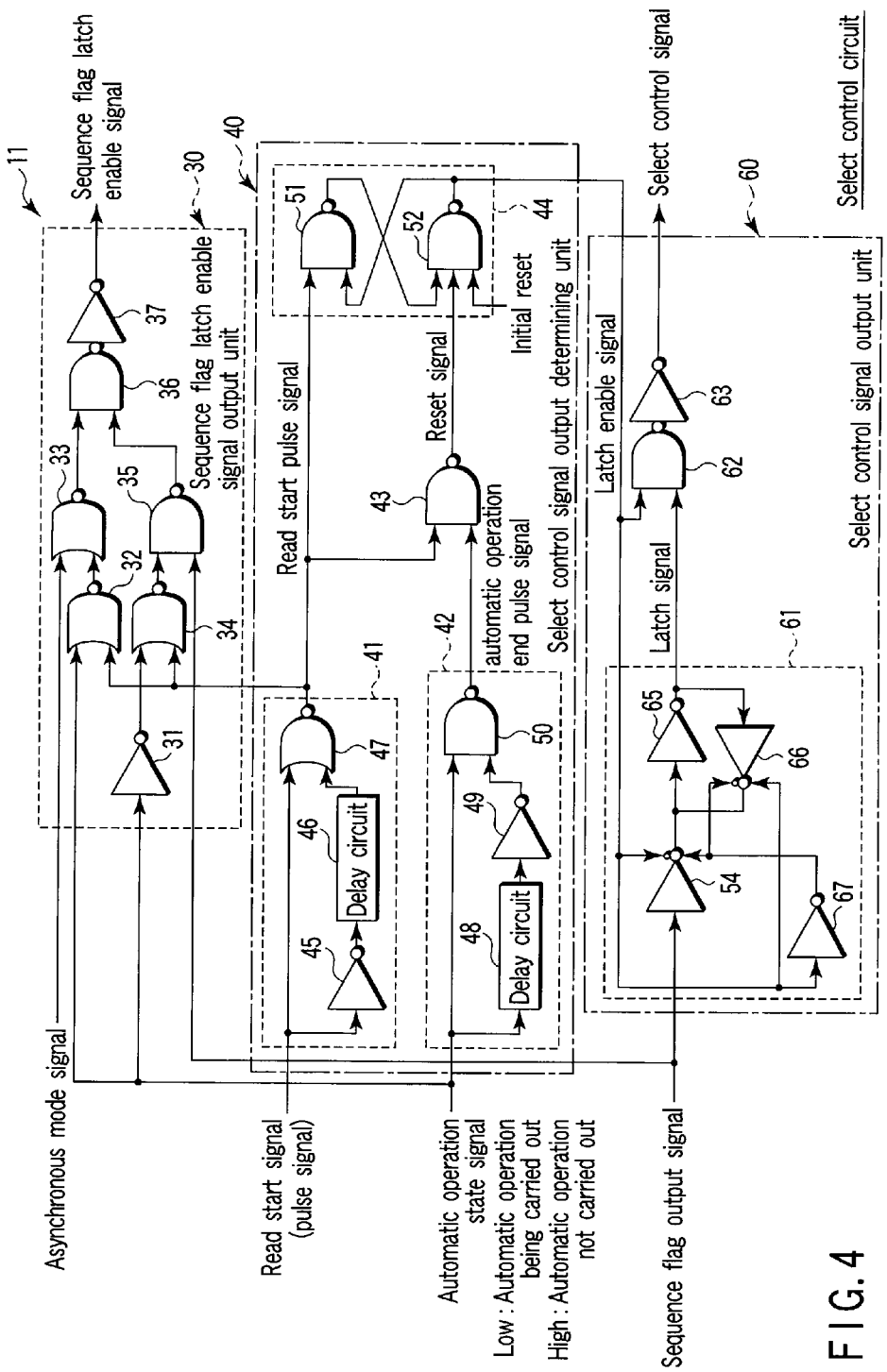
FIG. 4 is a circuit diagram of a select control circuit according to the embodiment.

FIG. 4 is a circuit diagram of the select control circuit 11. As shown in FIG. 4, the select control circuit 11 generally includes a sequence flag latch enable signal output unit 30, a select control signal output determining unit 40, and a select control signal output unit 60. The sequence flag latch enable signal output unit 30 generates and outputs a sequence flag latch enable signal. The select control signal output determining unit 40 generates a latch enable signal for determining whether to output a select control signal, or whether to assert a select control signal. The select control signal output unit 60 generates and outputs a select control signal on the basis of the latch enable signal and sequence flag output signal. Hereinafter, the details of the circuit configuration will be explained.

The sequence flag lath enable signal output unit 30 includes inverters 31, 37, NOR gates 32 to 34, and NAND gates 35, 36. The inverter 31 inverts an automatic operation state signal supplied from the automatic operation control circuit 8. The NOR gate 32 performs a NOR operation on the automatic operation state signal and a read start pulse signal output from the select control signal output determining unit 40. The NOR gate 33 performs a NOR operation on an asynchronous mode signal and the output of the NOR gate 32. The NOR gate 34 performs a NOR operation on the output of the inverter 31 and the read start pulse signal. The NAND gate 35 performs a NAND operation on the output of the NOR gate 34 and the sequence flag output signal output from the automatic operation control circuit 8. The NAND gate 36 performs a NAND operation on the output of the NOR gate 33 and the output of the NAND gate 35. The inverter 37 inverts the output of the NAND gate 36 and outputs the result of the inversion as a sequence flag latch enable signal.

The select control signal output determining unit 40 generally includes a read start pulse signal generating unit 41, an automatic operation end pulse signal generating unit 42, a NAND gate 43, and an RS flip-flop 44.

The read start pulse signal generating unit 41 includes an inverter 45, a delay circuit 46, and a NOR gate 47. The inverter 45 inverts a read start signal supplied from the read control circuit 4. The delay circuit 46 inverts the output of the inverter 45. The NOR gate 47 performs a NOR operation on the output of the delay circuit 46 and the read start signal and outputs the result of the operation as a read start pulse signal. Accordingly, the read start pulse signal is at the "L" level during the time from when the read start signal is output (or made "H" level) until the period equal to the sum of the period during which the read start signal is at the "H" level and the delay time of the delay circuit 46 has elapsed.

The automatic operation end pulse signal generating unit 42 includes a delay circuit 48, an inverter 49, and a NAND gate 50. The delay circuit 48 delays the automatic operation state signal. The inverter 49 inverts the output of the delay circuit 48. The NAND gate 50 performs a NAND operation on the output of the inverter 49 and the automatic operation state signal and outputs the result of the operation as an automatic operation end pulse signal. Accordingly, the automatic operation end pulse is kept at the "L" level during the time from when the automatic operation state signal is negated (or made "H" level) until the delay time of the delay circuit 48 has elapsed.

The NAND gate 43 performs a NAND operation on the read start pulse signal and the automatic operation end pulse signal and outputs the result of the operation as a reset signal.

The RS flip-flop 44 includes NAND gates 51, 52. The NAND gate 51 performs a NAND operation on the output of the NAND gate 52 and the read start pulse signal. The NAND gate 52 performs a NAND operation on the output of the NAND gate 51, a reset signal, and an initial reset signal and outputs the result of the operation as a latch enable signal. The initial reset signal is a signal for resetting the RS flip-flop 44. The initial reset signal is normally at "H" level. Accordingly, when the reset signal is asserted (or made "L" level), the RS-F/F is brought into the reset state, making the latch enable signal "L" level.

The select control signal output unit 60 generally includes a latch circuit 61, a NAND gate 62, and an inverter 63.

The latch circuit 61 includes clocked inverters 64, 66 and inverters 65, 67. The inverter 67 inverts the latch enable signal. The clocked inverter 64, which uses the latch enable signal and the output of the inverter 67 as the clock for a p-channel MOS transistor and the clock for an n-channel MOS transistor respectively, operates when the latch enable signal is at "L" level. That is, when the latch enable signal is at "L" level, the clocked inverter 64 takes in the sequence flag output signal and inverts it. The inverter 65 inverts the output of the clocked inverter 64 and outputs the inverted result as a latch signal. The clocked inverter 66, which uses the output of the inverter 67 and the latch enable signal as the clock for a p-channel MOS transistor and the clock for an n-channel MOS transistor respectively, operates when the latch enable signal is at "H" level. The inverter 66 inverts the latch signal and outputs the inverted result to the input node of the inverter 65.

The NAND gate 62 performs a NAND operation on the latch enable signal and the latch signal. The inverter 63 inverts the output of the NAND gate 62 and outputs the inverted result as a select control signal.

Figure 5:
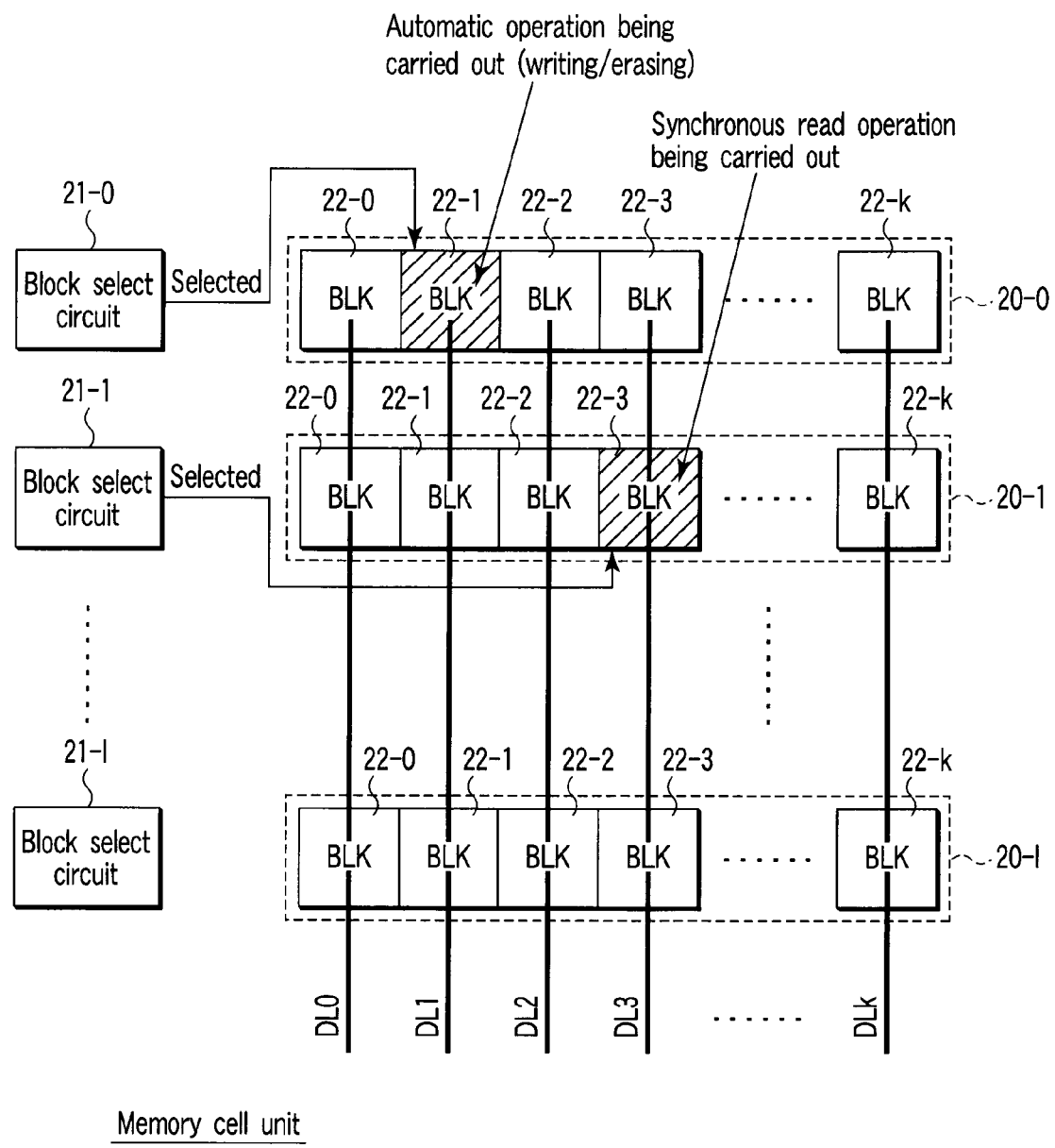
FIG. 5 is a circuit diagram of a memory cell unit according to the embodiment.

Next, a simultaneous execution of a synchronous read operation and an automatic operation in the NOR flash memory 1 with the above configuration will be described briefly with reference to FIG. 5. FIG. 5 is a block diagram of the memory cell unit 5 of the flash memory 1 according to the embodiment.

With the configuration of the embodiment, the memory cell unit 5 includes a plurality of memory banks 20. Each of the banks 20 can be selected by the block select circuit 21. Therefore, even when a memory bank 20 is in an automatic operation, another memory bank 20 can be accessed in a synchronous read operation. For example, as shown in FIG. 5, suppose memory bank 20-0 is selected by the block select circuit 21-0 in an automatic operation and further memory block 22-1 in memory bank 20-0 is selected. That is, data is written into or erased from a memory cell MC included in memory block 22-1 in memory bank 20-1.

At this time, in a synchronous read operation, memory bank 20-1 to 20-l excluding memory bank 20-0 can be accessed. In the example of FIG. 5, block select circuit 21-1 selects memory bank 20-1 and further selects memory block 22-3 in memory bank 20-1. That is, data is read from a memory cell MC included in memory block 22-3 in memory bank 20-1.

By accessing a plurality of memory banks 20 simultaneously in this way, the processing efficiency of the NOR flash memory can be improved. The simultaneously accessible memory banks 20 basically differ from one another. The reason is that simultaneous access to the same memory bank 20 may lead to malfunction. However, for example, while a memory bank 20 is in an automatic operation, a synchronous read operation might be performed on the same memory bank 20. In this case, the NOR flash memory 1 outputs a sequence flag in place of cell data, thereby externally reporting that the memory bank 20 accessed in the synchronous read operation is now in an automatic operation. The following three cases of the operation at this time will be explained below.

<Case 1: when a Sequence Flag is Output>

Figure 6:
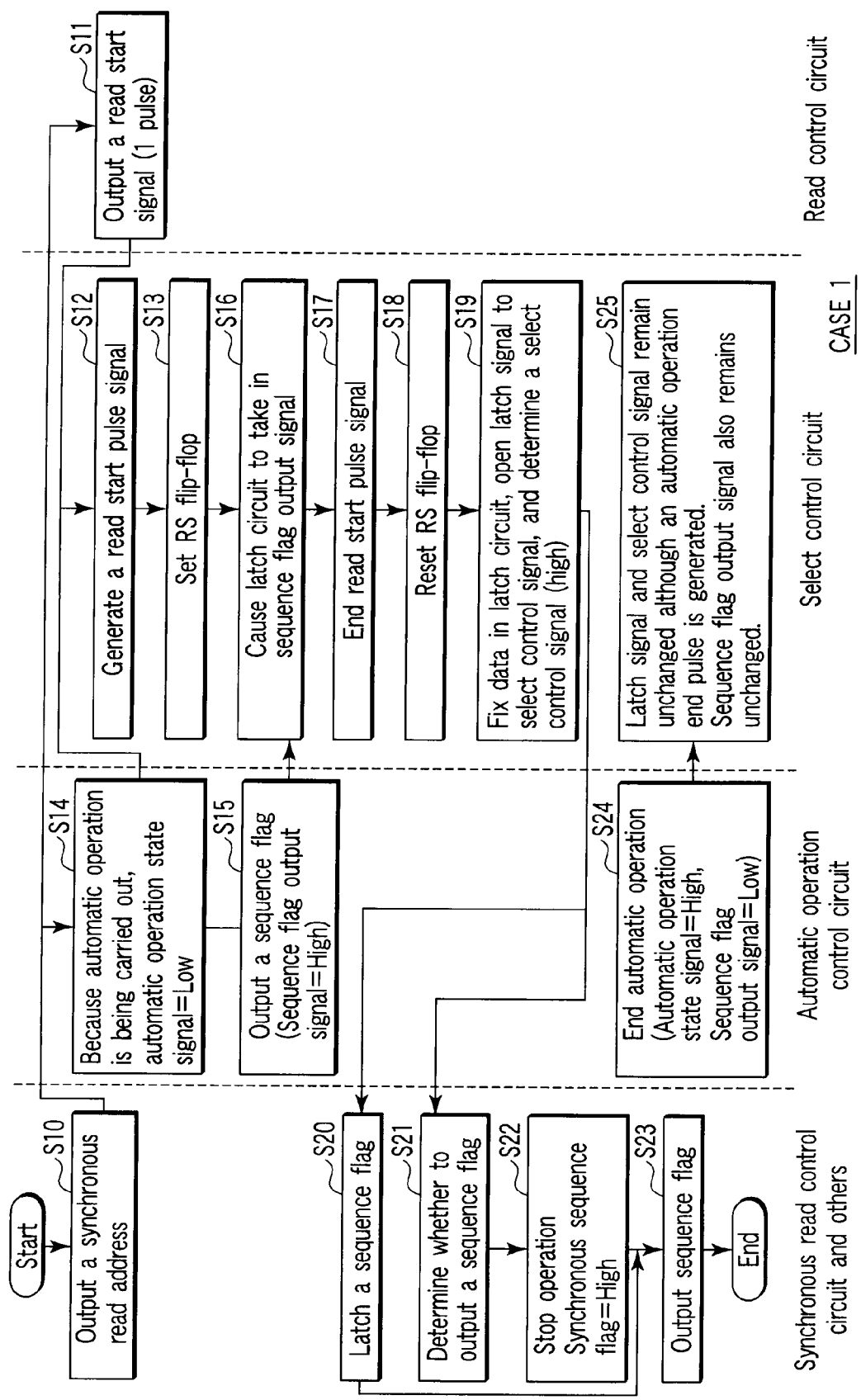
FIG. 6 is a flowchart to help explain the operation of the flash memory according to the embodiment.
Figure 7:
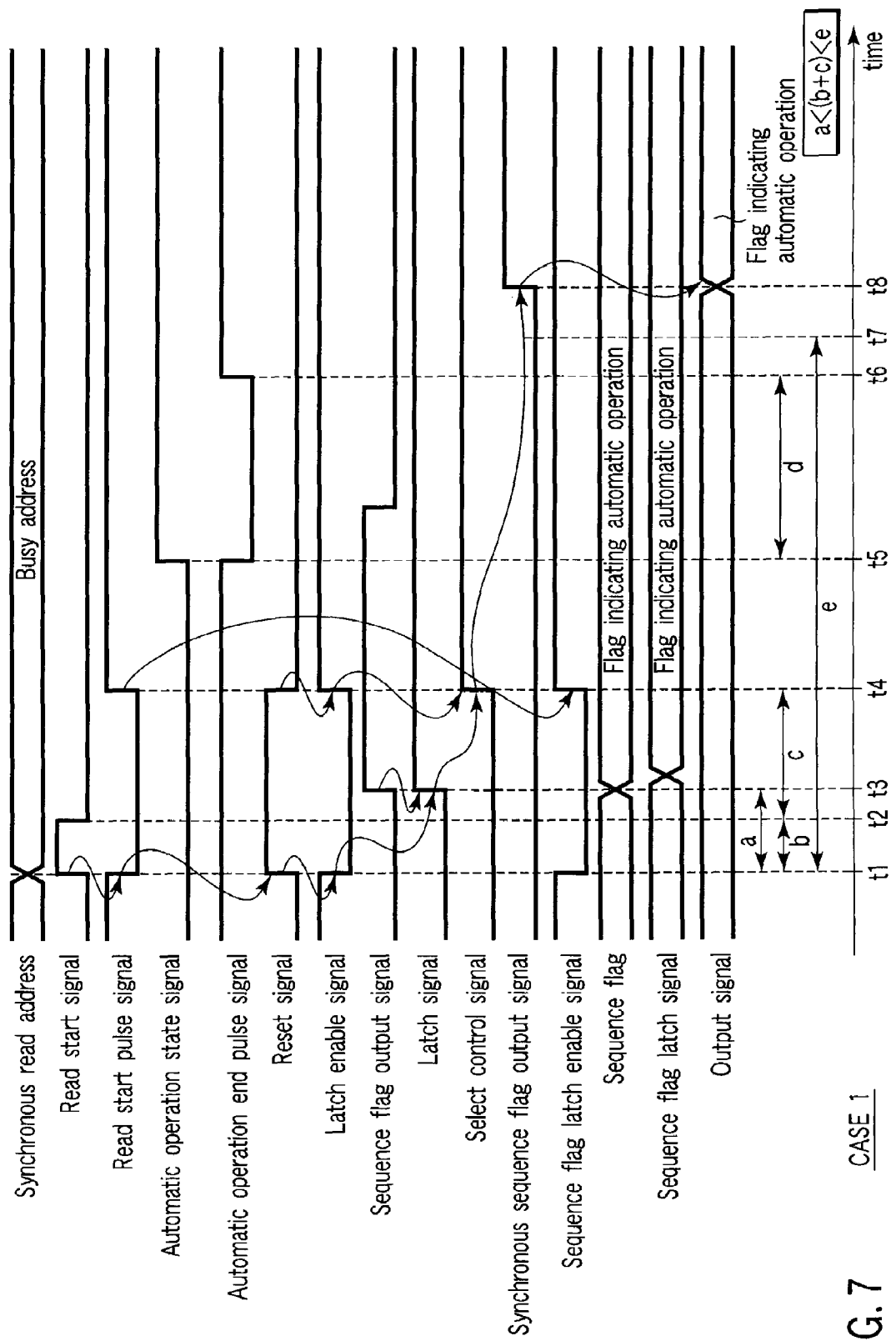
FIG. 7 is a timing chart for various signals in the operation of the flash memory according to the embodiment.

First, a case where a sequence flag is output instead of cell data in a synchronous operation will be explained using FIGS. 6 and 7. FIG. 6 is a flowchart to help explain the operation of the NOR flash memory. FIG. 7 is a timing chart for various signals.

First, the synchronous read control circuit 3 outputs a synchronous read address (step S10, time t1). Suppose the synchronous read address is an address corresponding to the memory bank 20 now in an automatic operation. To start a synchronous read operation, the read control circuit 4 outputs a read start signal (step S11). The read start signal, which is a pulse signal, is made "H" level only during the period from time t1 to time t2 as shown in FIG. 7.

Then, the read start pulse signal generating unit 41 in the select control circuit 11 generates a read start pulse signal (step S12, time t1). That is, the read start pulse signal is made "L" level. This brings the RS flip-flop 44 into the set state (step S13).

Since the automatic operation control circuit 8 is in an automatic operation, the automatic operation state signal is made "L" level (step S14). Moreover, the automatic operation control circuit 8 senses that the synchronous read address supplied from the synchronous read control circuit 3 indicates the memory bank now in an automatic operation and outputs not only a sequence flag but also a sequence flag output signal (step S15, time t3). That is, the sequence flag output signal is made "H" level. Then, the sequence flag output signal is taken in by the latch circuit 61 of the select control circuit 11 (step S16).

Thereafter, since the output of the read start pulse signal ends (or goes to "H" level in step S7 at time t4), the RS flip-flop 44 is brought into the reset state (step S18). As a result, the data in the latch circuit 16 is fixed and a select control signal is output (step S19). That is, the select control signal is made "H" level. The data in the latch circuit 9 has been fixed with at the sequence flag output from the automatic operation control circuit 8 (step S20).

Then, the synchronous read control circuit 3 determines at time t7 whether to output a sequence flag (step S21). This is the process of determining whether to cause the select circuit 10 to select synchronous read data or a sequence flag. Since the select control signal is at "H" level, the synchronous read control circuit 3 makes the synchronous sequence flag output signal "H" level and further stops the operation (step S22, time t8). As a result, the sequence flag selected by the select circuit 10 is output from the output circuit (step S23).

Thereafter, even if the automatic operation state signal goes to "H" level and the sequence flag output signal goes to the "L" level after the automatic operation has ended (step S24), the latch signal, select control signal, and sequence flag latch signal in the select control circuit 11 remain unchanged (step S25).

CASE 1 corresponds to a case where the following timing is satisfied as shown in FIG. 7:

period $a$<(period $b$+period $c$)<period $e$ where
period a: a period from when a synchronous read operation is started until a sequence flag output signal goes to "H" level
period b: the pulse time of a read start signal
period c: the delay time of the delay circuit 46
period e: a period from when a synchronous read operation is started until the output of a sequence flag is determined <CASE 2: when the Automatic Operation Ends Immediately after a Synchronous Read Operation has Started (Part 1)>

Figure 8:
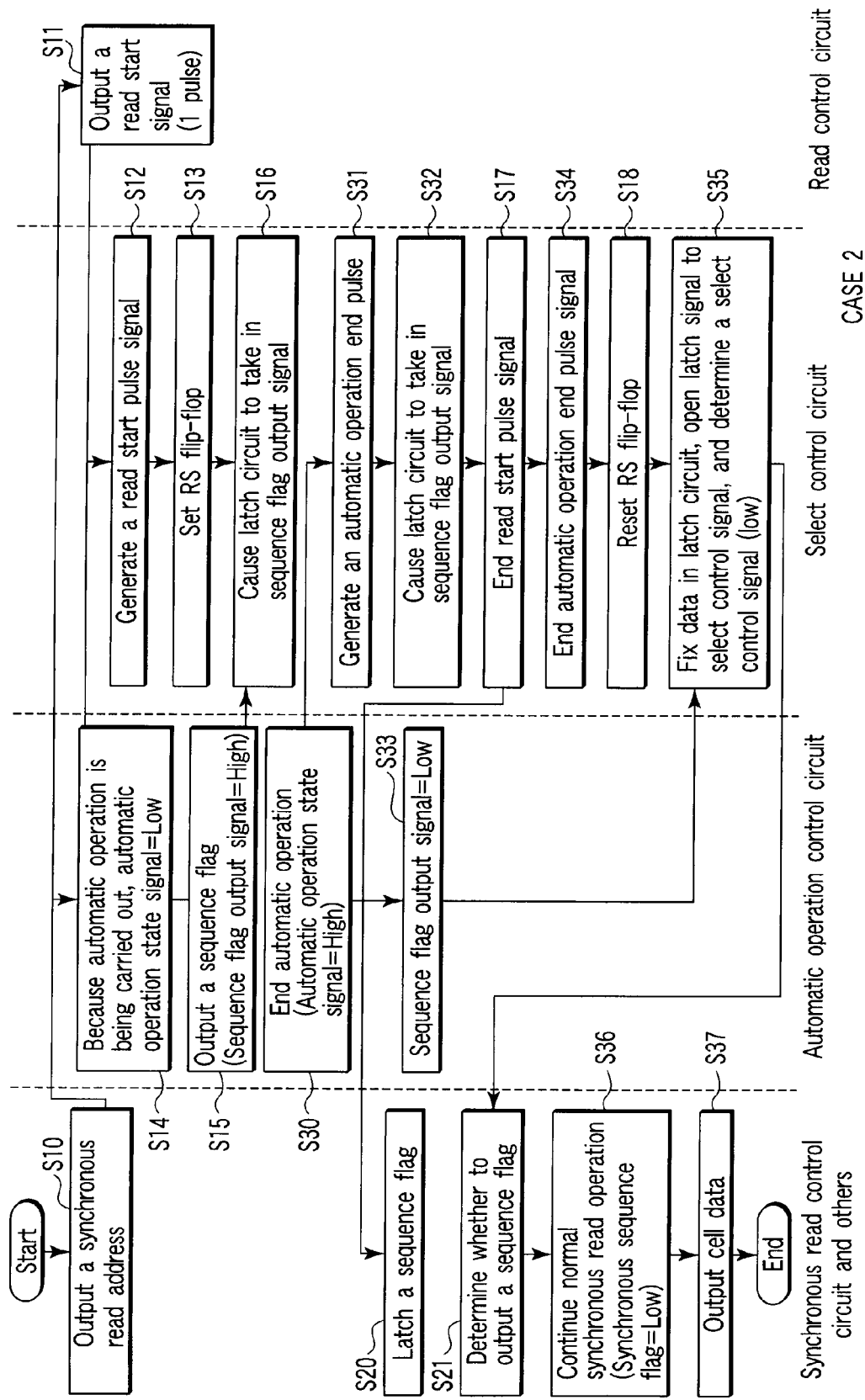
FIG. 8 is a flowchart to help explain the operation of the flash memory according to the embodiment.
Figure 9:
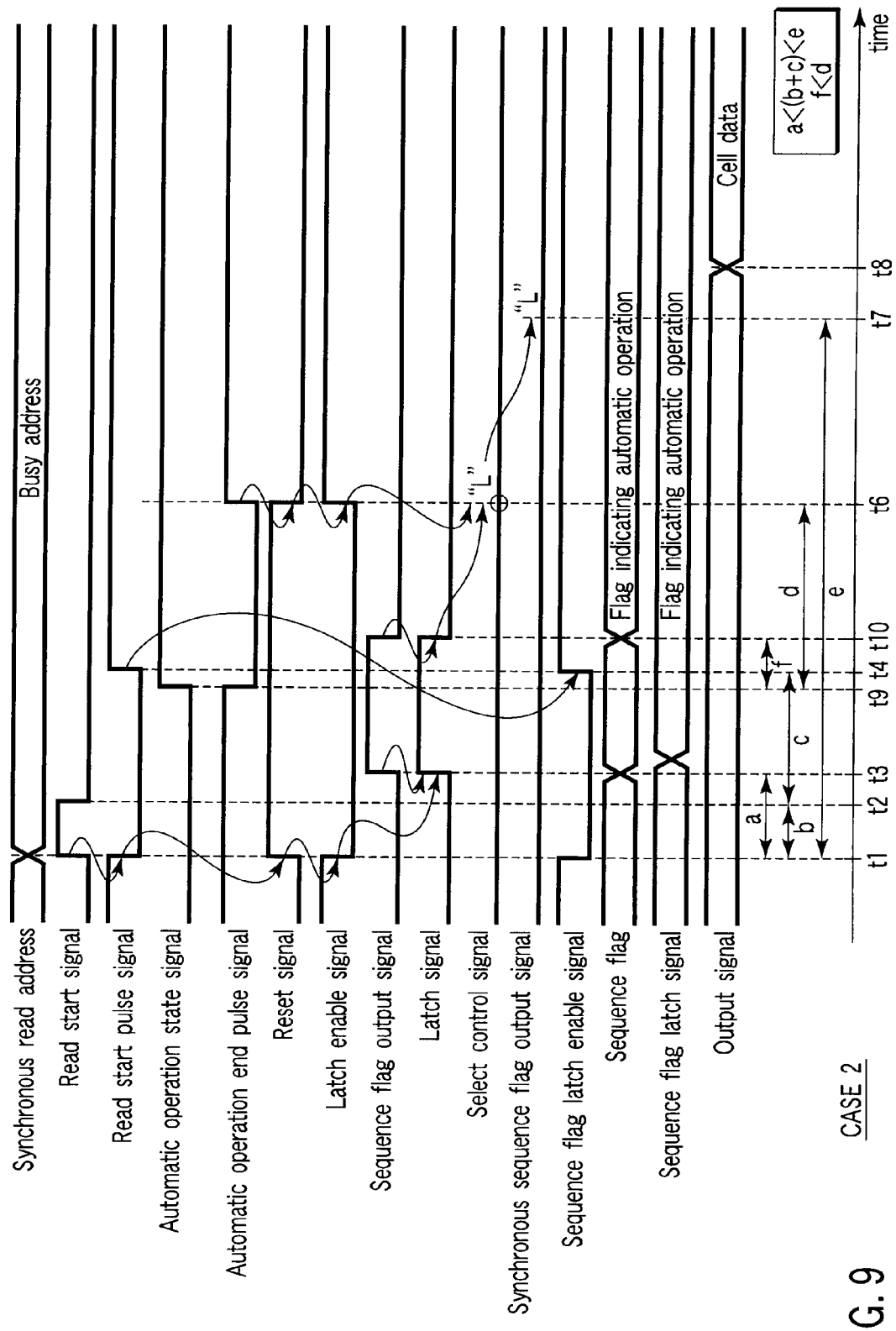
FIG. 9 is a timing chart for various signals in the operation of the flash memory according to the embodiment.

Next, a case where the automatic operation ends immediately after the synchronous read operation has started will be explained. In this case, since a synchronous read operation is possible, the flash memory outputs cell data, not a sequence flag. This will be explained using FIGS. 8 and 9. FIG. 8 is a flowchart to help explain the operation of the NOR flash memory 1. FIG. 9 is a timing chart for various signals.

First, the operations up to step S16 (time t3) are the same as those in CASE 1. Suppose the automatic operation ends immediately after the synchronous read operation has started. Here, "immediately after the synchronous read operation has started" means that the automatic operation ends and the automatic operation state signal goes to the "H" level before the read start pulse signal ends (or goes to the "H" level) at time t4.

When the automatic operation has ended and the automatic operation state signal has gone to the "H" level (step S30, time t9), the automatic operation end pulse signal generating unit 42 in the select control circuit 11 generates an automatic operation end pulse signal (step S31, time t9). That is, the automatic operation end pulse signal is made "L" level.

Furthermore, from time t9 on, the latch circuit 61 continues taking in the sequence flag output signal (step S31). Thereafter, with the sequence flag output signal at the "H" level, the read start pulse signal ends (step S17, time t4). That is, the read start pulse signal goes to the "H" level. This makes the sequence flag latch enable signal "H" level, which fixes the data in the latch circuit 9 (step S20).

Thereafter, at time t10, the sequence flag output signal goes to the "L" level, which also makes the latch signal "L" level (step S33).

Thereafter, at time t6, since the automatic operation end pulse signal ends (or goes to the "H" level at step S34), the RS flip-flop 44 is reset (step S18). As a result, the data in the latch circuit 61 is fixed at the "L" level and therefore the select control signal is also fixed at the "L" level (step S35).

Then, the synchronous read control circuit 3 determines at time t7 whether to output a sequence flag (step S21). This is the process of determining whether to cause the select circuit 10 to select synchronous read data or a sequence flag. Since the select control signal is at the "L" level, the synchronous read control circuit 3 makes the synchronous sequence flag output signal "L" level and continues the normal synchronous read operation (step S36, time t8). As a result, the cell data selected by the select circuit 10 is output from the output circuit (step S37).

CASE 2 corresponds to a case where the following timing is satisfied:

period $a$<(period $b$+period $c$)<period $e$ period $f$<period $d$ where
period d: the delay time of the delay circuit 48
period f: a period from when the automatic operation ends until the sequence flag output signal goes to the "L" level <CASE 3: when the Automatic Operation Ends Immediately after a Synchronous Read Operation has Started (Part 2)>

Figure 10:
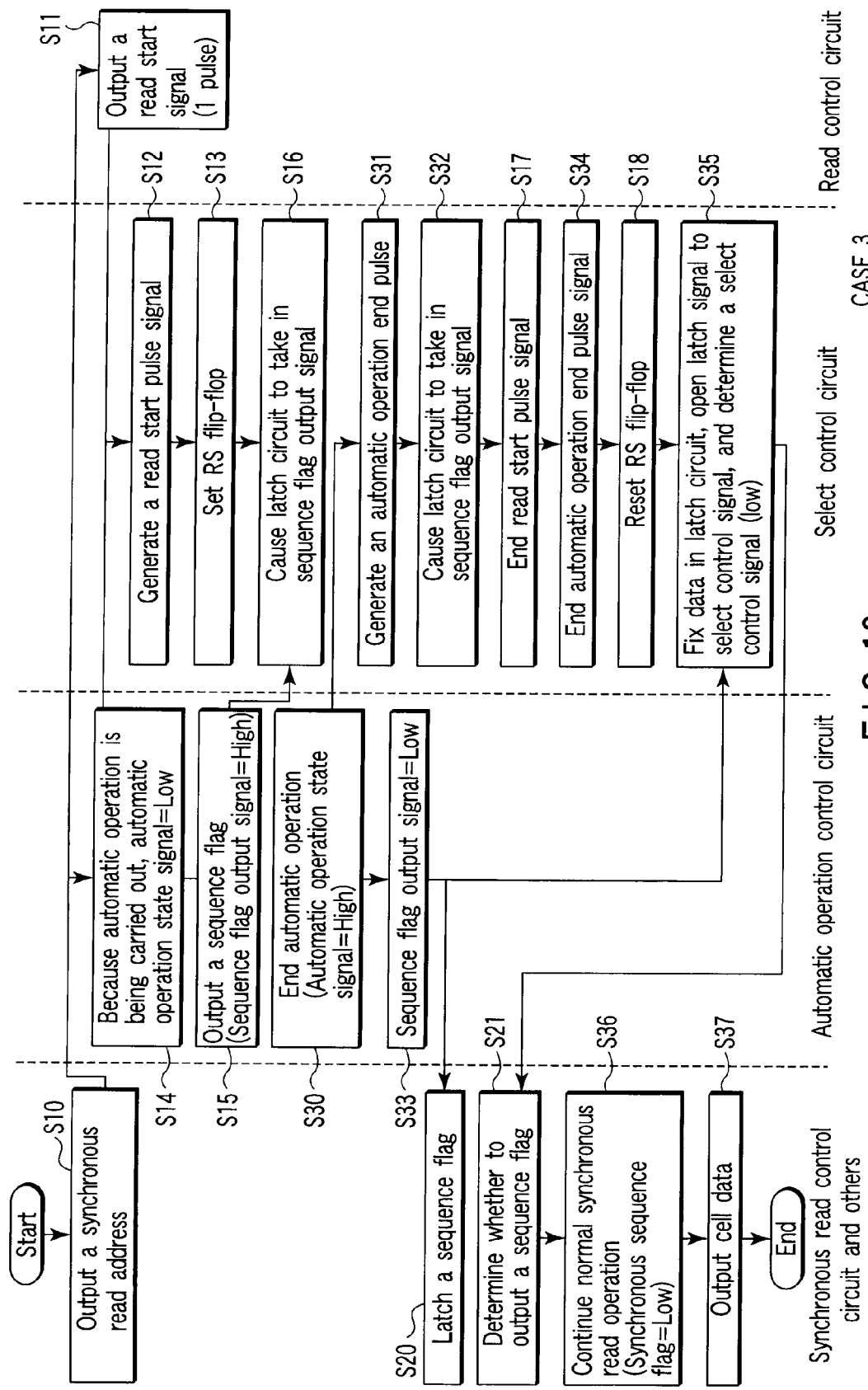
FIG. 10 is a flowchart to help explain the operation of the flash memory according to the embodiment.
Figure 11:
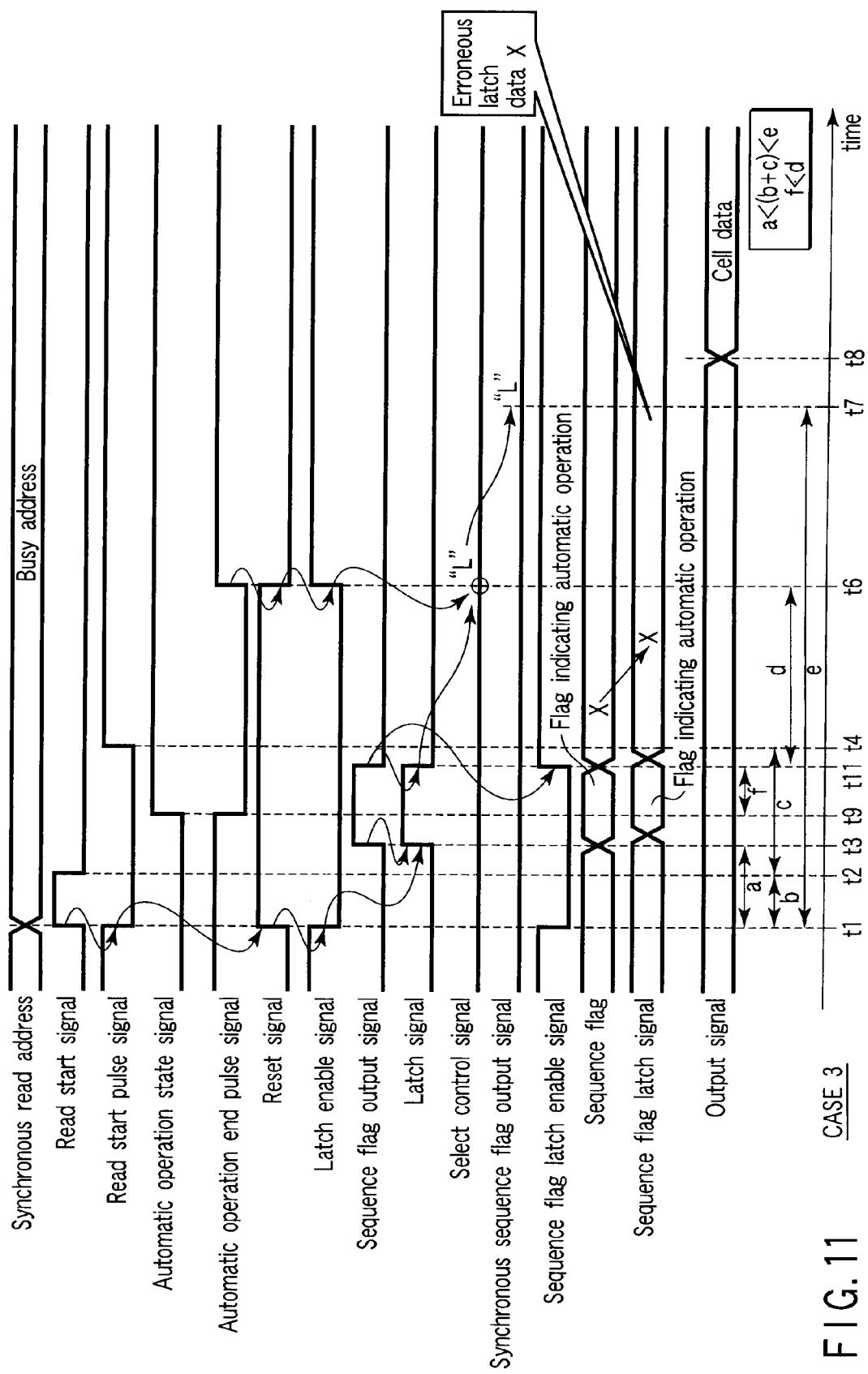
FIG. 11 is a timing chart for various signals in the operation of the flash memory according to the embodiment.

Next, as in CASE 2, a case where the automatic operation ends immediately after a synchronous read operation has started will be explained. However, CASE 3 differs from CASE 2 in that the sequence flag output signal goes to the "L" level earlier than the read start pulse signal ends. That is, the time the automatic operation ends in CASE 3 is earlier than in CASE 2. FIG. 10 is a flowchart to help explain the operation of the NOR flash memory 1 in CASE 3. FIG. 11 is a timing chart for various signals.

First, the operations up to step S31 (time t9) are the same as those in CASE 2. Specifically, from time t3 on, the sequence flag output signal goes to the "H" level, which is taken in by the latch circuit 61 (step S16). Moreover, from time t9 on, the latch circuit 61 continues taking in the sequence flag output signal (step S31).

Thereafter, with the read start pulse signal at the "L" level, the automatic operation control circuit 8 stops the output of sequence flag and makes the sequence flag output signal "L" level (step S33, time t11). With this timing, the sequence flag latch enable signal goes to the "H" level, which fixes the data in the latch circuit 9 (step S20). At this time, the latch circuit 9 is liable to store erroneous data. This is represented as erroneous latch data X in FIG. 11.

Thereafter, at time t4, the read start pulse signal ends (step S17). At time t6, the automatic operation pulse signal ends (step S34). This resets the RS flip-flop (step S18). Then, the data in the latch circuit 61 is fixed at the "L" level and the select control signal is also fixed at the "L" level (step S35). The operations after that are the same as those in CASE 2. The output circuit outputs cell data.

Like CASE 2, CASE 3 satisfies the following timing conditions: period $a$<(period $b$+period $c$)<period $e$ and period $f$<period $d$.

Figure 12:
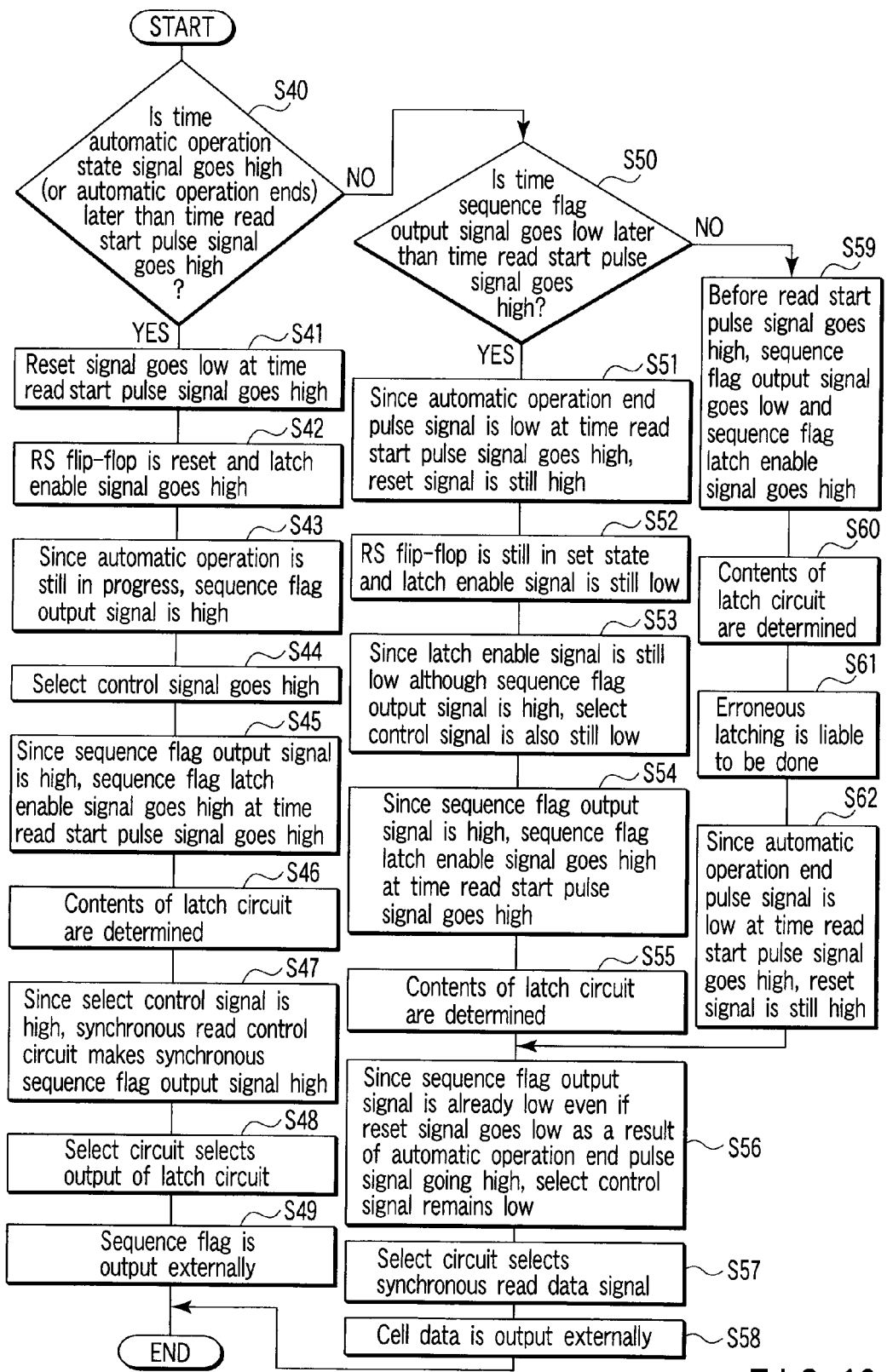
FIG. 12 is a flowchart to help explain the operation of the flash memory according to the embodiment.

In CASE 1 to CASE 3, particularly the details of the operation of the select control circuit 11 will be explained below using the flowchart of FIG. 12.

<CASE 1>

CASE 1 is a case where the time the automatic operation state signal goes to the "H" level, or the time the automatic operation ends, is later than the time the read start pulse signal goes to the "H" level (YES in step S40).

In this case, a reset signal is made "L" level when the read start pulse signal goes to the "H" level (step S41). The reason is that, since the automatic operation is still being carried out at this point, the automatic operation end pulse is at the "H" level and therefore the result of the operation at the NAND gate 43 is "H" level. This resets the RS flip-flop 44 and the latch enable signal goes to the "H" level (step S42).

At this point, since the automatic operation is still in progress, the sequence flag output signal stays "H" level and the latch signal is "H" level. In this state, the latch enable signal goes to the "H" level, with the result that the clocked inverter 64 stops its operation and the clocked inverter 66 starts to operate. That is, the latch circuit 61 stops taking in the sequence flag output signal and continues holding the high-level signal previously input. Then, since both the latch enable signal and the latch signal are at the "H" level, the select control signal goes to the "H" level (step S44).

Furthermore, with the time the read start pulse signal goes to the "H" level in CASE 1, the sequence flag output signal is "H" level, with the result that the sequence flag latch enable signal changes from the "L" level to the "H" level (step S45). Accordingly, in this stage, the data in the latch circuit 9 is fixed (step S46). That is, in a state where the automatic operation control circuit 8 continues outputting a sequence flag, the data in the latch circuit 9 is fixed.

Thereafter, the processes are carried out as described above. Specifically, since the select control signal is "H" level, the synchronous read control circuit makes the synchronous sequence flag output signal "H" level (step S47). As a result, the select circuit 10 selects a sequence flag latch signal (step S48) and the output circuit 12 outputs the sequence flag latch signal externally (step S49).

<CASE 2>

Next, CASE 2 will be explained. CASE 2 corresponds to a case where the time the automatic operation state signal goes to the "H" level is earlier than the time the read start pulse signal goes to the "H" level (NO in step S40). In addition, the time the sequence flag output signal goes to the "L" level is later than the time the read start pulse signal goes to the "H" level (YES in step S50).

In this case, since the automatic operation has already ended at the time the read start pulse signal goes to the "H" level and therefore the automatic operation end pulse signal is "L" LEVEL, the reset signal stays "H" level differently from CASE 1 (step S51). Therefore, the RS flip-flop 44 is still set and the latch enable signal stays "L" level (step S52). Accordingly, the clocked inverter 64 is in operation and the clocked inverter 66 is out of operation. That is, the latch circuit 61 continues taking in the sequence flag output signal. In other words, the latch circuit 61 is in a through state. Accordingly, although the sequence flag output signal is "H" level, since the latch enable signal stays "L" level, the select control signal also stays "L" level (step S53).

As in CASE 1, in CASE 2, at the time the read start pulse signal goes to the "H" level, the sequence flag output signal is "H" level, with the result that the sequence flag latch enable signal changes from the "L" level to the "H" level (step S54). Accordingly, in this stage, the data in the latch circuit 9 is fixed (step S55). That is, in a state where the automatic operation control circuit 8 continues outputting a sequence flag, the data in the latch circuit 9 is fixed.

Thereafter, the select control signal to stay "L" level since the sequence flag output signal is already the "L" level even if the automatic operation end pulse signal goes to the "H" level, allowing the reset signal goes to the "L" level (step S56). That the sequence flag output signal stays "H" level at this point means that the automatic operation is still being carried out. Therefore, the select control signal is made "H" level and the select circuit 10 selects a sequence flag latch signal.

Since the select control signal is "L" level, the synchronous read control circuit 3 makes the synchronous sequence flag output signal "L" level. As a result, the select circuit 10 selects a synchronous read data signal (step S57) and the output circuit 12 outputs the synchronous read data signal externally (step S58).

<CASE 3>

Next, CASE 3 will be explained. CASE 3 corresponds to a case where the time the automatic operation state signal goes to the "H" level is earlier than the time the read start pulse signal goes to the "H" level (NO in step S40). In addition, the time the sequence flag output signal goes to the "L" level is earlier than the time the read start pulse signal goes to the "H" level differently from CASE 2 (NO in step S50).

In this case, the sequence flag output signal goes to the "H" level before the read start pulse signal goes to the "H" level. Accordingly, although the read start pulse signal is the "L" level at this point, the sequence flag latch enable signal changes to the "H" level because the automatic operation state signal is the "H" level (step S59). As a result, the contents of the latch circuit 9 are fixed (step S61).

Here, CASE 3 differs from CASE1 and CASE 2 in that the time the contents of the latch circuit 9 are fixed is equal to the time the output of the sequence flag is stopped in CASE 3. That is, in CASE 1 and CASE 2, the output of the sequence flag is stopped after the time the contents of the latch circuit 9 are fixed. This enables the latch circuit 9 to take in the sequence flag accurately. In CASE 3, however, the contents of the latch circuit 9 are fixed logically at the same time that the output of the sequence flag is stopped. In some cases, it is possible that the output of the sequence flag has already been stopped and data at the sequence flag output node where noise or the like has occurred is taken in by the latch circuit 9 (step S61). This is erroneous latch data X shown in FIG. 11.

Thereafter, even if the read start pulse signal goes to the "H" level, since the automatic operation end pulse signal is the "L" level, the reset signal is still the "H" level and the select control signal is the "L" level (step S62). Furthermore, even if the automatic operation end pulse signal goes to the "H" level, since the sequence flag output signal is already the "L" level, the select control signal is the "L" level (step S56).

As described above, even if each signal changes from one level to another at such a time the sequence flag is latched erroneously, the select control signal is fixed to the "L" level and the select circuit 10 selects cell data. Accordingly, the signal erroneously latched in the latch circuit 9 is prevented from being output externally, which enables the operational reliability of the flash memory to be improved.

As described above, with the semiconductor memory device of the embodiment, it is possible to prevent an erroneously latched sequence flag from being output in a flash memory capable of carrying out an automatic operation and a synchronous read operation simultaneously and improve the operational reliability of the flash memory.

Specifically, with the configuration of the embodiment, the flash memory has the select control circuit 11. The select control circuit 11 generates a read start pulse signal from a read start signal. The pulse width of the read start pulse signal is equal to the sum of the width of the read start signal and the delay time of the delay circuit 46. While an automatic operation is carrying out, a select control signal is generated using the read start pulse signal as a trigger. That is, providing the select control circuit 11 causes the transition period of the select control signal (or the timing of the transition to the "H" level) to be fixed to the timing after an elapse of (the width of the read start signal+the delay time of the delay circuit) since the start of the synchronous read operation. Then, when a sequence flag is output, since the sequence flag is latched with this timing, the sequence flag is latched properly.

The select control circuit 11 generates an automatic operation end pulse signal from an automatic operation state signal. The pulse width of the automatic operation end pulse signal is equal to the delay time of the delay circuit 48. If a synchronous read operation is started during an automatic operation and then the automatic operation ends immediately, the select control signal is kept "L" level by the automatic operation end pulse signal. Then, at the time the automatic operation end pulse ends, the select control signal is fixed at the "L" level and is supplied to the synchronous read control circuit 3. In this case, the timing of latching the sequence flag is the time that the read start pulse signal ends or the time that the sequence flag output signal goes to the "L" level. In the latter case, although the latch circuit 9 might latch a sequence flag erroneously, there is no problem with the operation, since no sequence flag latch signal is output. As described above, when an automatic operation ends before the timing of fixing the select control signal, the select control circuit 11 makes the select control signal low without allowing the high sequence flag output signal to be transmitted to the synchronous read control circuit, thereby carrying out a normal synchronous read operation.

As described above, an erroneously latched sequence flag is prevented from being output and a malfunction can be avoided by, if an automatic operation is being carried out, making select control signal high and latching the sequence flag at a time after an elapse of (width of read start signal+ delay time of delay circuit) in a synchronous read operation and, if the automatic operation has ended before the time, not making the select control signal high. Furthermore, fixing the changing point of the select control signal output from the automatic operation control circuit to the synchronous read control circuit to a time after an elapse of (width of read start signal+delay time of delay circuit) makes it unnecessary to take measures to deal with asynchronous, such as metastable, since the time synchronous read control circuit determines whether to output a sequence flag is later than the changing point.

While the select control circuit 11 has been explained using the circuit example of FIG. 4, the embodiment is not limited to the configuration of FIG. 4, provided the operation shown in each of FIGS. 6, 8, 10, and 12 can be carried out. Moreover, the embodiment is not restricted to the NOR flash memory and may be applied to another flash memory, such as a NAND flash memory, and further to suitable semiconductor memories other than flash memories.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device capable of simultaneously carrying out a first operation of reading data from nonvolatile memory cells and a second operation of writing data into or erasing data from the memory cells, the semiconductor memory device comprising:
   a memory cell array which includes the memory cells;
   a first control circuit which controls the first operation according to a first address signal and outputs a read start signal when the reading of the data is started;
   a second control circuit which controls the second operation according to a second address signal and outputs a sequence flag when the first and second addresses coincide with each other;
   a latch circuit which latches the sequence flag;
   a select control circuit which generates a read start pulse signal and a select control signal and which generates the read start pulse signal by delaying the read start signal, the select control signal, when the sequence flag is output, being asserted if the second operation is being carried out or being negated if the second operation has not been carried out at the time the output of the read start pulse signal ends; and
   a select circuit selects either the sequence flag held in the latch circuit or the data read by the first control circuit according to an instruction from the first control circuit and outputs the selected one, the first control circuit instructing the select circuit to select the sequence flag if the select control signal is asserted or the data if the select control signal is negated.

2. The device according to claim 1, wherein the select control circuit fixes the content of the latch circuit at the time the read start pulse signal ends, if the time the output of the sequence flag ends is later than the time the read start pulse signal ends, or fixes the content of the latch circuit at the time the output of the sequence flag ends, if the time the output of the sequence flag ends is earlier than the time the read start pulse signal ends.

3. The device according to claim 1, wherein the second control circuit outputs an automatic operation state signal and a sequence flag output signal to the select control circuit,
   the automatic operation state signal is asserted while the second operation is being executed or is negated while the second operation is not executed,
   the sequence flag output signal is asserted in a period when the sequence flag is being output or is negated in a period when the sequence flag is not output,
   the select control circuit generates an automatic operation end pulse signal by delaying the automatic operation state signal output from the second control circuit,
   the sequence flag output signal at the time the read start pulse signal ends is output as the select control signal if the time the automatic operation state signal is negated is later than the time the read start pulse signal ends, and
   the sequence flag output signal at the time the automatic operation end pulse signal ends is output as the select control signal if the time the automatic operation state signal is negated is earlier than the time the read start pulse signal ends.

4. The device according to claim 3, wherein the select control circuit includes
   a read start pulse generating unit which has a first delay circuit and generates the read start signal in an output period of the read start signal and a period of the delay time of the first delay circuit,
   an automatic operation end pulse signal generating unit which has a second delay circuit and generates the automatic operation end pulse signal asserted during the period from when the automatic operation state signal is asserted until the delay time of the second circuit expires,
   a flip-flop which is brought into a reset state when the read start pulse signal has been output and the automatic operation end pulse signal has been asserted, and
   a select control signal output unit which asserts the select control signal if the sequence flag output signal has been asserted at the time when the flip-flop is brought into the reset state.

5. The device according to claim 4, wherein the period from when the read start signal is output until the sequence flag output signal is asserted is shorter than the period during which the read start pulse signal is generated, and
   the period during which the read start pulse signal is generated is shorter than the period from when the read start signal is output until the first control circuit instructs the select circuit to select either the sequence flag or the data.

6. The device according to claim 1, wherein the memory cell array includes memory blocks each of which includes the memory cells,
   a plurality of memory banks each of which includes the memory blocks, and
   a block select circuit which selects any one of the memory blocks in any one of the memory banks.

7. The device according to claim 6, wherein the first operation and second operation are performed simultaneously on the memory banks differing from one another.

8. The device according to claim 6, wherein each of the memory blocks includes the memory cells each of which has a stacked gate including a charge storage layer and a control gate formed above the charge storage layer and which are arranged in a matrix in each of the memory blocks, word lines which commonly connect the control gates of the memory cells in the same row in each of the memory blocks, and bit lines which commonly connect drains of the memory cells in the same column in each of the memory blocks, the memory blocks are arranged in a matrix in the memory cell array, and the memory cell blocks in the same column in the memory cell array are connected to the same one of the bit lines.

9. A method of controlling a semiconductor memory device comprising:

performing a first operation on a memory bank in a second operation, data being read in the first operation, data being written or erased in the second operation, and the memory bank including a plurality of memory cells;

outputting a pulse-like read start signal in response to the start of the first operation;

outputting a read start pulse signal by delaying the read start signal;

outputting a sequence flag indicating that the first operation and the second operation are being performed on the same memory bank;

ending the second operation;

ending the output of the sequence flag in response to the end of the second operation;

latching the sequence flag at the earlier one of the time the output of the sequence flag ends and the time the output of the read start pulse signal ends, if the time the second operation ends is later than the time the output of the read start pulse signal ends; and outputting the data read in the first operation after the sequence flag is latched, regardless of the content of the latched sequence flag.

10. The method according to claim 9, further comprising latching the sequence flag at the time the output of the read start pulse signal ends, if the time the second operation ends is later than the time the output of the read start pulse signal ends; and outputting the latched sequence flag.

* * * * *